Figure 1:
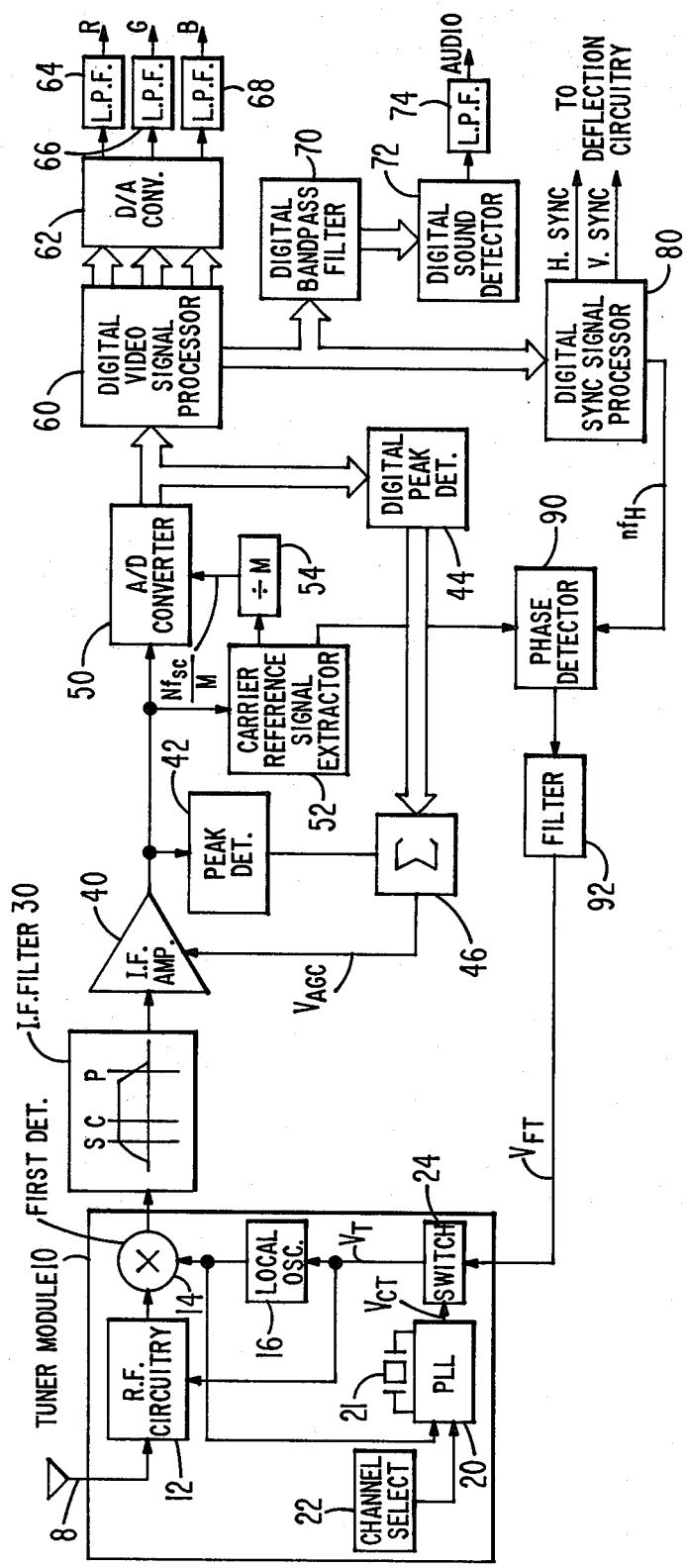

United States Patent [19]  [11] 4,434,439
Steckler et al.  [45] Feb. 28, 1984

[54] DIGITAL TELEVISION AGC ARRANGEMENT

[75] Inventors: Steven A. Steckler, Clark; Alvin R. Balaban, Lebanon, both of N.J.

[73] Assignee: RCA Corporation, New York, N.Y.

[21] Appl. No.: 350,580

[22] Filed: Feb. 22, 1982

[51] Int. Cl.³ .............................................. H04N 5/52
[52] U.S. Cl. .................................... 358/174; 358/176; 358/179
[58] Field of Search ......................... 358/174, 176, 179; 455/234, 246, 241, 249, 250, 251

[56] References Cited

U.S. PATENT DOCUMENTS 3,699,325 10/1972 Montgomery, Jr. et al. ....... 235/310
3,806,864 4/1974 Broding et al. ........................ 367/77
3,930,256 12/1975 Amemiya ......................... 340/347 R
3,947,806 3/1976 Corkhill et al. ....................... 367/67
3,981,006 9/1976 Takayama et al. .......... 340/347 AD
4,141,041 2/1979 Peters .................................... 358/174
4,191,995 3/1980 Farrow ................................. 364/157
4,209,805 6/1980 Ikeda .................................... 358/175
4,225,976 9/1980 Osborne ............................... 455/246

FOREIGN PATENT DOCUMENTS 1239585 7/1971 United Kingdom .
2035732A 6/1980 United Kingdom .
2042294A 9/1980 United Kingdom .
2059202A 9/1980 United Kingdom .

OTHER PUBLICATIONS

B. Grob, *Basic Television-Principles and Servicing*, First Edition, McGraw-Hill Book Co., 1949,pp. 252-257.

*Primary Examiner*—Michael A. Masinick
*Attorney, Agent, or Firm*—E. M. Whitacre; P. J. Rasmussen; E. P. Herrmann

[57] ABSTRACT

An automatic gain control arrangement is provided for an analog to digital (A/D) converter in a television signal processing system. A gain-controlled source of analog signals applies a video information signal to the input of an A/D converter. The A/D converter produces digitized video signal samples at an output which is coupled to a digital peak detector. The digital peak detector detects the level of the digital samples of the synchronizing signal components. The detected sync signal level is compared with a desired value or range of values. If the detected sync signal level is not at the desired level or is outside the desired range, the count of a counter is incremented or decremented accordingly. The count of the counter is converted to an analog voltage which is applied to the gain-controlled signal source to control the level of the analog signal applied to the A/D converter. The analog voltage may also be combined with a control voltage produced by an analog peak detector, which detects the level of the input signal to the A/D converter, to produce a composite gain control signal.

10 Claims, 2 Drawing Figures

DIGITAL TELEVISION AGC ARRANGEMENT

This invention relates to television signal processing systems in which an analog television information signal is converted to digitized signal samples for digital video signal processing and, in particular, to an automatic gain control arrangement for the analog signal of such a system.

In television signal processing systems such as a television receiver in which the received analog television signal is digitized by an analog to digital (A/D) converter for digital processing of television information, it is generally desirable to control the dynamic range of the analog signal which is to be digitized. The A/D converter is usually designed to produce digitized samples corresponding to levels of a given analog input signal range. If the analog input signal exceeds or drops below the given range, the A/D converter will produce inaccurate signal samples. Hence, it is desirable to maintain the level of the analog signal through gain control to levels within the given range.

In accordance with the principles of the present invention, an automatic gain control arrangement is provided for an A/D converter in a television signal processing system. A gain-controlled source of analog signals applies a video information signal to the input of an A/D converter. The A/D converter produces digitized video signal samples at an output which is coupled to a digital peak detector. The digital peak detector detects the level of the digital samples of the synchronizing signal components. The detected sync signal level is compared with a desired value or range of values. If the detected sync signal level is not at the desired level or is outside the desired range, the count of a counter is incremented or decremented accordingly. The count of the counter is converted to an analog voltage which is applied to the gain-controlled signal source to control the level of the analog signal applied to the A/D converter.

In accordance with the principles of a further aspect of the present invention, the automatic gain control system utilizes a control signal produced by sensing the levels of both the analog input signal to the A/D converter and the digital output signal of the A/D converter.

Figure 2:
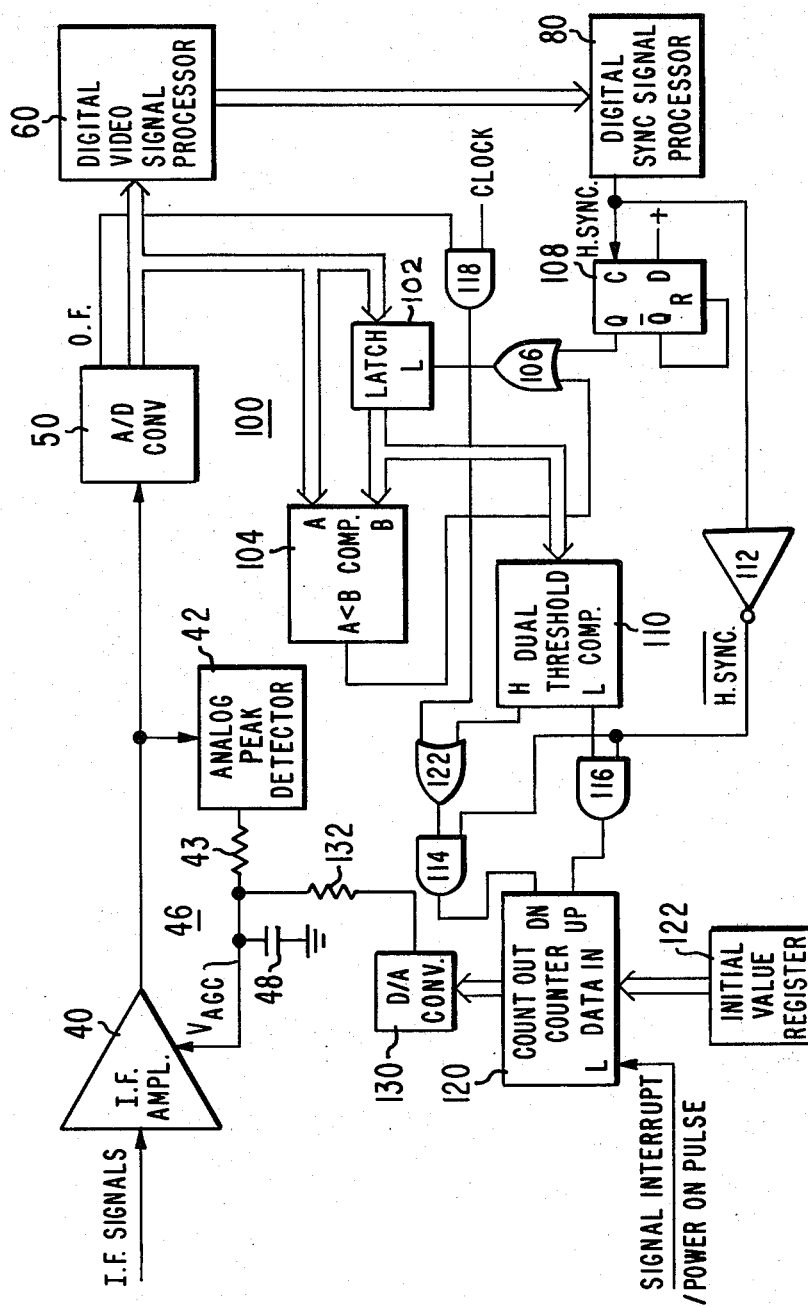

In the drawings:

FIG. 1 illustrates, in block diagram form, a digital television receiver including an automatic gain control system constructed in accordance with the principles of the present invention; and FIG. 2 illustrates, partially in block diagram form and partially in schematic diagram form, a more detailed embodiment of an automatic gain control system constructed in accordance with the principles of the present invention.

Referring to FIG. 1, the signal processing section of a television receiver is shown. Radio frequency (r.f.) signals are received by an antenna 8 and applied to r.f. circuitry 12 of a tuner module 10. The r.f. circuitry 12 includes frequency selective and amplification circuits which provide amplified r.f. signals to one input of a first detector or mixer 14. Channel selection circuits 22 in the tuner module produce digital signals corresponding to the selected channel. The digital signals control a phase-locked loop 20 so as to produce a coarse tuning voltage, $V_{CT}$, for controlling a local oscillator 16 so that its frequency bears a proportional relationship, determined by the channel number, to a reference frequency produced by a crystal oscillator indicated by crystal 21. The $V_{CT}$ voltage is coupled by way of a switch 24 to inputs of the r.f. circuitry 12 and the local oscillator 16. The tuning voltage $V_T$ applied to the r.f. circuitry 12 adjusts the tuning of the frequency selective circuits for the selected television channel, in tracking relationship with the frequency of the local oscillator 16. The local oscillator 16 provides an oscillatory signal for the mixer 14 which heterodynes the r.f. signal of the selected television channel to a specific i.f. frequency band. Once the coarse tuning voltage $V_{CT}$ has tuned the local oscillator for reception of a desired channel signal, reception is maintained by switching the switch 24 so that the local oscillator 16 is controlled by a fine tuning voltage $V_{FT}$. A tuning system of this type is described in greater detail in U.S. Pat. No. 4,031,549.

The signals produced by the mixer 14, now at television intermediate frequencies, are applied to an i.f. filter 30. The i.f. filter 30 shapes the response characteristic for the i.f. signals of the selected television channel. Signals above and below the limits of the i.f. passband are attenuated by the i.f. filter.

The i.f. signals passed by the i.f. filter are applied to an i.f. amplifier 40, which amplifies (or attenuates) the i.f. signals in response to a gain control voltage $V_{AGC}$. The amplified i.f. signals are then applied to an A/D converter 50 for digitization. The i.f. signals are sampled by the A/D converter 50 in response to a sampling signal $Nf_{sc}/M$. Digitized video signals of, for example, eight bits, are produced by the A/D converter 50. The digital signals include both video and sound information.

The digital signal is applied to a digital video signal processor 60, which separates and processes the video picture information and produces digital red, green and blue color signals. A digital video signal processor suitable for use as processor 60 is shown and described in U.S. patent application No. 297,556, filed Aug. 31, 1981, and entitled "DIGITAL COLOR TELEVISION SIGNAL DEMODULATOR". These signals are applied to a digital-to-analog (D/A) converter 62, which converts the signals to analog form. The analog signals produced by the D/A converter 62 are applied to low pass filters 64, 66 and 68, which removes unwanted higher frequency components of the analog signals to produce R, G and B color signals for display on a kinescope.

Digital signals containing sound and synchronizing signal information are coupled from the digital video signal processor to inputs of a digital bandpass filter 70 and a digital sync signal processor 80. The digital bandpass filter 70 passes digital sound information in the vicinity of the sound carrier to a digital sound detector 72. The digital sound detector detects the audio information and produces, for example, a pulse-width modulated signal representing audio information. This signal is filtered by a lowpass filter 74 to recover the audio information for subsequent reproduction.

The digital sync signal processor 80 extracts and separates the horizontal and vertical sync signals and produces horizontal and vertical rate pulse trains for deflection circuitry (not shown) in the television receiver. The digital sync signal processor also produces a signal which is a multiple, n, of the horizontal sync signal frequency $f_H$, and is substantially in a constant phase relationship with the horizontal synchronizing signal. This signal, $nf_H$, is applied to one input of a phase detector 90, which also receives a signal representative of the extracted picture carrier signal from a carrier reference signal extractor 52. The phase detector 90 compares the phase of these two signals, and generates a control signal which is filtered by a filter 92 and applied to the switch 24 in the tuner module as fine tuning voltage $V_{FT}$. The fine tuning voltage $V_{FT}$ controls the local oscillator 16 so as to maintain the i.f. picture carrier in a substantially constant phase relationship with the horizontal synchronizing signal.

The A/D converter 50 converts the i.f. signals directly into digital signal samples suitable for baseband signal processing without the need for a second (video) detector. The carrier reference signal extractor circuit 52 has an input coupled to receive the i.f. signal and produces a signal which is aligned in frequency and in a substantially constant phase relationship with the picture carrier. This signal is divided in frequency by a divide-by-M circuit 54 to produce a sampling signal for the A/D converter 50. The carrier reference signal extractor 52 may comprise, by way of example, a frequency selective circuit tuned to the i.f. picture carrier frequency and an amplifier, or a phase-locked loop circuit which produces an oscillatory signal at the i.f. picture carrier frequency. The oscillatory signal is then divided down to the desired sampling frequency. The A/D converter 50 samples the analog i.f. signal in response to the sampling signal and converts the samples to digital words at the sampling signal rate.

The arrangement of FIG. 1 is described in further detail in our concurrently filed U.S. patent application Ser. No. 351,307, DIGITAL TELEVISION RECEIVER, which is hereby incorporated by reference.

The present invention concerns an automatic gain control arrangement which is suitable for controlling the i.f. amplifier 40 to maintain the i.f. signals at the input to the A/D converter within the proper dynamic range. A digital peak detector 44 is coupled to the output of the A/D converter 50, and detects the peak excursion of the digitized synchronizing signal components of the video signal. The synchronizing signal peaks are at a known level, which may be expressed in IRE units, relative to the full amplitude of the video signal. Thus, when the synchronizing signal peaks are maintained within a given range of digital levels, the video information portion of the signal is known to be within a given range. As the synchronizing signal peaks vary in digital level, the video information range of the signal will vary correspondingly. Thus, a control signal is generated by the digital peak detector 44 in relationship to the synchronizing signal peaks and used to control the gain of the i.f. amplifier 40 to maintain the video i.f. signal within the dynamic range requirements of the A/D converter 50.

In accordance with a further aspect of the present invention, an analog peak detector 42 is coupled to sample the peaks of the i.f. signal at the input of the A/D converter 50. The peak detector 42 produces a control signal representative of the i.f. signal peaks. This control signal is combined in a summing network 46 with the control signal produced by the digital peak detector. A composite control signal is thereby developed to control the gain of the i.f. amplifier 40.

The use of the analog peak detector 42 allows the system to respond quickly to sudden signal changes which may be encountered during channel changes or start-up. For instance, when the receiver is properly cotrolled in gain, the i.f. video signal is permitted to vary over virtually the full dynamic input range of the A/D converter. If the receiver is then switched to another channel with a signal twice as strong as the one received previously, the i.f. signal amplitude may be expected to increase, and may exceed the dynamic range of the A/D converter. The peak detector 42 will quickly respond to this overload condition and reduce the gain of the i.f. amplifier. The receiver is thereby promptly returned to a proper operating condition.

Since the $V_{AGC}$ signal is developed from control signals from two peak detectors, different time constants can be chosen for the two control signal components to tailor the system response for effective operation. For instance, the analog peak detector can have a short response time constant so as to be able to quickly respond to overload conditions, while the digital peak detector can have a longer response time constant with finer control increments, so as to be able to hold the synchronizing signal peaks within a relatively narrow range of digital values.

In addition, the type of peak detection may be chosen to provide more effective control of the type of i.f. signal produced by the i.f. amplifier 40. For instance, if the i.f. amplifier produces a signal with positive-going sync signal components (i.e., the i.f. signal is at its full normal amplitude during synchronizing signal intervals), both the analog and digital peak detectors may be arranged to sense the peak signal excursions to prevent the i.f. signal from exceeding the upper limit of the dynamic range of the A/D converter. On the other hand, if the i.f. amplifier 40 produces a video i.f. signal with negative-going sync signal components, the i.f. signal will exhibit minimum peak excursions during the synchronizing signal intervals, and maximum peak excursions during reception of a white luminance signal. The analog peak detector may then be arranged to sense the peak white-going signal excursions to keep the video signal from exceeding the upper limit of the dynamic range of the A/D converter. The digital peak detector may be arranged to detect the minimum digital signal levels occurring during the synchronizing signal levels to keep the synchronizing signal peaks above the lower limit of the range of the A/D converter. A detailed embodiment of an automatic gain control system arranged in this manner is shown in FIG. 2.

In FIG. 2, a digital peak detector 100 has inputs coupled to receive digitized signals produced by the A/D converter 50. The output of the A/D converter 50 is coupled to the input of a register or latch 102, and the A input of a comparator 104. The output of the latch 102 is coupled to the B input of the comparator 104. The output of the comparator 104 is coupled to one input of an OR gate 106, the output of which is coupled to the load signal input L of the latch 102.

A horizontal sync signal, H. Sync., produced by the digital sync signal processor 80, is applied to the clock input C of a D-type flip-flop 108, and to the input of an inverter 112. An inverted horizontal sync signal, $\overline{\text{H. Sync.}}$, is produced at the output of the inverter 112. The data input D of the flip-flop 108 is coupled to receive a positive (logical one) voltage. The $\overline{\text{Q}}$ output of the flip-flop 108 is coupled to the reset input R of the flip-flop. The Q output of the flip-flop 108 is coupled to a second input of the OR gate 106.

The output of the latch 102 of the peak detector 100 is also coupled to the input of a dual threshold or window comparator 110. The high output H of the dual threshold comparator 110 is coupled to one input of an OR gate 122, and the low output L of the comparator 110 is coupled to one input of an AND gate 116. An overflow bit line of the A/D converter 50 is coupled to one input of an AND gate 118, the other input of which is coupled to receive a clock pulse train signal. The output of AND gate 118 is coupled to a second input of the OR gate 122, the output of which is coupled to an input of an AND gate 114. The output of the inverter 112 is coupled to second inputs of the AND gates 114 and 116.

The output of the AND gate 114 is coupled to the down clock input DN of an up/down counter 120. The output of the AND gate 116 is coupled to the up clock input UP of the counter 120. An initial value register 122 holds an initial value for the counter 120, and is coupled to the data input of the counter 120. A signal interrupt/power on pulse is applied to the load input L of the counter 120. This pulse may be produced by the tuner module 10 of FIG. 1, for example, and is produced when the television receiver is first turned on or the channel of the receiver is changed.

The output of the counter 120 is coupled to the input of a digital-to-analog (D/A) converter 130. The output of the D/A converter 130 is coupled by way of a resistor 132 to the control signal input of the i.f. amplifier 40. The analog peak detector 42, which is of conventional design, has an output coupled by way of a resistor 43 to the control signal input of the i.f. amplifier 40. An AGC filter capacitor 48 is also coupled between the control signal input of the i.f. amplifier 40 and ground. Resistors 132 and 43 and capacitor 48 comprise the summing network 46 of FIG. 1.

The H. Sync. signal is in time correspondence with each synchronizing signal interval of the digitized video signal. At the beginning of a sync pulse, the H. Sync. signal sets flip-flop 108, causing its Q output to go high (logical one) and its $\overline{Q}$ output to go low (logical zero). Since the $\overline{Q}$ output of the flip-flop is coupled to its reset input, the low-going $\overline{Q}$ signal will proceed to reset the flip-flop 108. Thus, the flip-flop 108 will produce a very short pulse at its Q output at the beginning of each sync pulse.

The short pulse produced at the Q output of flip-flop 108 is coupled by way of OR gate 106 to the L input of the latch 102, which will load the digital value of the video signal produced at that time into the latch. The video signal value stored by the latch 102 is applied to the B input of the comparator 104, where it is continuously compared with new video signal values applied to the A input of the comparator. If one of the new signal values at the A input of the comparator 104 is lower than the value stored in the latch, the A<B output of the comparator produces a pulse which loads the new, lower value into the latch. At the end of the synchronizing pulse, the latch 102 will contain the value of the negative-going sync signal.

The peak value of the negative-going sync signal is compared with two threshold values in the dual threshold comparator. These threshold values may be programmed or hardwired into the comparator 110, and define the upper and lower desirable limits of the sync signal peak. If the sync signal peak is above the upper threshold, a logical one signal is produced at the H output of the comparator. If the sync signal peak is below the lower threshold, a logical one signal is produced at the L output of the comparator. If the sync signal peak is at or between the theshold values, logical zero signals are produced at both comparator outputs.

At the end of the sync signal interval, the $\overline{\text{H. Sync.}}$ signal goes high, enabling AND gates 114 and 116. If the sync signal peak is above the upper comparator threshold, the logical one signal at the H output of the comparator clocks the DN input of the counter 120, and the count of the counter is reduced by one. Similarly, a logical one signal at the L output of the comparator 110 will increment the count of the counter. If the sync signal peak is within the desired limits, the count of the counter is not changed. The count of the counter 120 is converted to an analog control voltage by the D/A converter 130 and applied to the i.f. amplifier 40.

As the count of the counter 120 increases or decreases, the gain of the i.f. amplifier is increased or decreased accordingly. For example, assume that the D.C. reference level of the analog input signal to the A/D converter 50 is referenced to the lowest quantization level (all zeroes out) of the A/D converter, and that it is desired to maintain the negative-going sync signal peak within a range of digital values 2 and 4. If the i.f. signal amplitude is too high, the peak detected value will be above the digital 4 level. The H output of the dual threshold comparator 110 will produce a pulse which will reduce the count of the counter 120 and hence the gain of the i.f. amplifier. This gain reduction will reduce the peak levels of white-going signals, bringing the video signal back into the dynamic range of the A/D converter and the sync signal peak back within its desired range.

In addition, an overflow bit of the A/D converter 50 provides an indication of an overrange signal condition of the input of the A/D converter. The overflow bit is ANDed with a clock pulse train signal in AND gate 118 and applies a series of pulses to the DN input of the counter during such overrange conditions, thereby bringing the overrange signal back within the desired range. The frequency of the clock pulse train determines the response of the automatic gain control system to such overrange conditions.

When the television receiver is first turned on or the television channel is changed, it is desirable to initialize the gain of the i.f. amplifier at a nominal value. At these times, the signal interrupt/power on pulse will load an intial count value into the counter 120 from the register 122. When a television signal is acquired, the counter 120 will begin to count up or down from this nominal value.

The analog peak detector functions to detect white-going signal excursions, and will bring signals at overload levels within the dynamic range of the A/D converter by reducing the gain of the i.f. amplifier. The relative response times of the analog and digital detectors is controlled by selecting appropriate values for resistors 43 and 132, which are used to combine the two control signal components to produce the composite $V_{AGC}$ control signal.

What is claimed is:

1. In a signal processing system, including a source of analog signals including a synchronizing signal component, apparatus comprising:
    an analog signal amplifier having a first input coupled to receive said analog signals, a signal output, and a gain control signal input for receiving a gain control signal to control the gain of said amplifier;
    an analog-to-digital converter having an input coupled to the output of said analog signal amplifier, and an output at which digital signal samples are produced;

an analog amplitude detector circuit having an input coupled to receive the signal applied to the input of said analog-to-digital converter and an output at which a first signal representative of the amplitude of the analog signal applied to the input of said analog-to-digital converter is produced;

a digital amplitude detector circuit having an input coupled to the output of said analog-to-digital converter and an output at which a second signal representative of the amplitude of the synchronizing signal component of the digital signal samples produced by said analog-to-digital converter is produced; and combining means having a first input coupled to the output of said analog amplitude detector circuit, a second input coupled to the output of said digital amplitude detector circuit, and an output coupled to said gain control signal input of said analog signal amplifier, for combining said first and second signals to produce said gain control signal.

2. In a television receiver, including a source of analog television signals including synchronizing signal components, apparatus comprising:

an analog signal amplifier, having a signal input coupled to receive said analog television signals, a signal output, and a gain control signal input for receiving a gain control signal to control the gain of said amplifier;

an analog-to-digital converter, having an input coupled to said signal output of said analog signal amplifier, and an output at which digitized television signal samples are produced;

a digital peak detector having an input coupled to the output of said analog-to-digital converter for sensing the levels of said synchronizing signal components of said digitized television signal samples; and means, having an input coupled to said digital peak detector and having an output coupled to said gain control signal input of said analog signal amplifier, and responsive to said levels of said synchronizing signal components for producing at its output said gain control signal.

3. The arrangement of claim 2, wherein said gain control signal producing means includes means responsive to said levels of said synchronizing signal components for producing a window signal indicative of the presence of said levels within a desired range of levels; and means, responsive to said window signal, for adjusting the value of said gain control signal when said levels are not within said desired range of levels.

4. The arrangement of claim 2, wherein said analog-to-digital converter further includes an output at which an overflow signal indicative of the application of an overrange analog input signal to the input of said analog-to-digital converter is produced; and further comprising:

means, having an input coupled to said overflow signal output of said analog-to-digital converter, and an output coupled to said gain control signal producing means, and responsive to said overrange indication signal for causing said gain control signal to change in a sense which reduces the gain of said analog signal amplifier.

5. The arrangement of claim 3, wherein said adjusting means comprises a counter having an input coupled to said window signal producing means, the count of said counter being adjusted in response to said window signal when said levels are not within said desired range of levels; and a digital analog converter, coupled between said counter and said gain control signal input of said analog signal amplifier, for producing a gain control signal representative of the count of said counter.

6. The arrangement of claims 3 or 5, wherein said window signal producing means comprises a dual threshold comparator.

7. The arrangement of claim 2, wherein said digital peak detector includes a register for storing ones of said digitized television signal samples, the value stored by said register being updated when a successive signal sample exceeds said stored value in a given sense.

8. The arrangement of claim 7, wherein said digital peak detector includes means for causing said register to store a new signal sample during each of ones of the synchronizing signal intervals of said television signal.

9. The arrangement of claims 7 or 8, wherein said digital peak detector further includes a comparator, responsive to said value stored in said register and said successive signal samples for causing said register to store a new signal sample when a successive signal sample exceeds said stored value in a given sense.

10. The arrangement of claim 2, further comprising an analog peak detector having an input coupled to the input of said analog-to-digital converter and an output coupled to said output of said digital peak detector.

* * * * *